(12) United States Patent
Chang et al.

(10) Patent No.: US 10,157,795 B2
(45) Date of Patent: Dec. 18, 2018

(54) SEMICONDUCTOR DEVICE

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW); Wei-Ting Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/727,626

(22) Filed: Oct. 8, 2017

(65) Prior Publication Data

US 2018/0033698 A1    Feb. 1, 2018

Related U.S. Application Data

(60) Continuation of application No. 15/253,805, filed on Aug. 31, 2016, now Pat. No. 9,786,564, which is a
(Continued)

(51) Int. Cl.
| | |
|---|---|
| *H01L 27/088* | (2006.01) |
| *H01L 27/092* | (2006.01) |
| *H01L 29/66* | (2006.01) |
| *H01L 29/78* | (2006.01) |
| *H01L 21/8234* | (2006.01) |

(Continued)

(52) U.S. Cl.
CPC ........... *H01L 21/823431* (2013.01); *H01L 21/823481* (2013.01); *H01L 21/845* (2013.01); *H01L 27/0886* (2013.01); *H01L 27/1211* (2013.01); *H01L 29/66477* (2013.01);
(Continued)

(58) Field of Classification Search
CPC ............. H01L 27/0886; H01L 27/1211; H01L 29/66545; H01L 29/66477; H01L 29/66795; H01L 29/7848; H01L 21/823481; H01L 21/823431; H01L 21/485
USPC ............... 257/368, 401, 392, 324, 192, 365, 257/E27.06, E27.061, E27.062, E29.255,
(Continued)

(56) References Cited

U.S. PATENT DOCUMENTS

| | | | |
|---|---|---|---|
| 6,977,837 B2 | 12/2005 | Watanabe et al. | |
| 7,719,043 B2 | 5/2010 | Yamagami et al. | |

(Continued)

FOREIGN PATENT DOCUMENTS

| | | |
|---|---|---|
| CN | 103828037 | 5/2014 |
| DE | 10 2009 046 250 A1 | 5/2011 |

(Continued)

*Primary Examiner* — Dao H Nguyen
(74) *Attorney, Agent, or Firm* — Maschoff Brennan

(57) ABSTRACT

A semiconductor device includes a substrate, a first gate, a second gate, and an insulating structure. The substrate includes a first fin and a second fin. The first gate is disposed over the first fin. The second gate is disposed over the second fin. A gap is formed between the first gate and the second gate, and the gap gets wider toward the substrate. The insulating structure is disposed in the gap. The insulating structure has a top surface and a bottom surface opposite to each other. The bottom surface faces the substrate. An edge of the top surface facing the first gate is curved inward the top surface.

20 Claims, 7 Drawing Sheets

Related U.S. Application Data division of application No. 14/754,627, filed on Jun. 29, 2015, now Pat. No. 9,461,043.

(60) Provisional application No. 62/171,050, filed on Jun. 4, 2015, provisional application No. 62/158,911, filed on May 8, 2015, provisional application No. 62/136,295, filed on Mar. 20, 2015.

(51) Int. Cl.
  *H01L 27/12* (2006.01)
  *H01L 21/84* (2006.01)
(52) U.S. Cl.
  CPC .. *H01L 29/66545* (2013.01); *H01L 29/66795* (2013.01); *H01L 29/7848* (2013.01)
(58) Field of Classification Search
  USPC .... 257/E21.002, E21.09, E21.159, E21.409, 257/E21.546; 438/283, 285, 287, 294
  See application file for complete search history.

(56) References Cited

U.S. PATENT DOCUMENTS

| | | | |
|---|---|---|---|
| 7,868,395 B2 | 1/2011 | Watanabe et al. | |
| 8,878,309 B1 | 11/2014 | Hong et al. | |
| 8,895,446 B2* | 11/2014 | Peng | H01L 21/76224 257/E21.006 |
| 9,041,125 B2 | 5/2015 | Lin et al. | |
| 9,048,121 B2* | 6/2015 | Kawa | H01L 27/0207 |
| 9,117,910 B2 | 8/2015 | Jeong et al. | |
| 9,240,483 B2 | 1/2016 | Lee et al. | |
| 9,281,208 B2* | 3/2016 | Kim | H01L 21/3083 |
| 9,299,811 B2 | 3/2016 | Kim et al. | |
| 9,362,181 B1 | 6/2016 | Xie et al. | |
| 9,576,859 B2* | 2/2017 | Tung | H01L 21/823821 |
| 2003/0192012 A1 | 10/2003 | Liu | |
| 2011/0095372 A1* | 4/2011 | Yuan | H01L 21/76229 257/368 |
| 2011/0169085 A1 | 7/2011 | Xu et al. | |
| 2013/0026571 A1 | 1/2013 | Kawa et al. | |
| 2014/0127872 A1 | 5/2014 | Oh et al. | |
| 2014/0145247 A1* | 5/2014 | Cheng | H01L 29/66545 257/288 |
| 2014/0252486 A1 | 9/2014 | Lin et al. | |
| 2015/0054089 A1 | 2/2015 | Hong et al. | |
| 2015/0228544 A1 | 8/2015 | Lin et al. | |
| 2015/0228647 A1 | 8/2015 | Chang et al. | |
| 2016/0093537 A1 | 3/2016 | Chen et al. | |
| 2016/0111542 A1 | 4/2016 | Zhang et al. | |
| 2016/0204194 A1 | 7/2016 | Cheng et al. | |

FOREIGN PATENT DOCUMENTS

| | | |
|---|---|---|
| DE | 10 2013 106 621 B3 | 5/2014 |
| KR | 10-2014-0111577 A | 9/2014 |
| WO | 2014/082336 A1 | 6/2014 |

* cited by examiner

SEMICONDUCTOR DEVICE

PRIORITY CLAIM AND CROSS-REFERENCE

The present application is a continuation of the application Ser. No. 15/253,805, filed on Aug. 31, 2016, which is a divisional of the application Ser. No. 14/754,627, filed on Jun. 29, 2015, which claims priority to U.S. Provisional Application Ser. No. 62/136,295, filed Mar. 20, 2015, U.S. Provisional Application Ser. No. 62/158,911, filed May 8, 2015, and U.S. Provisional Application Ser. No. 62/171,050, filed Jun. 4, 2015, which are incorporated herein by reference in their entireties.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FET is formed in this vertical fin. A gate is provided over (e.g., wrapping) the fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 6A are top views of a method for manufacturing a semiconductor device at various stages in accordance with some embodiments of the present disclosure.

FIGS. 1B to 6B are cross-sectional views respectively taking along line B-B of FIGS. 1A to 6A.

DETAILED DESCRIPTION

Figure 1A:
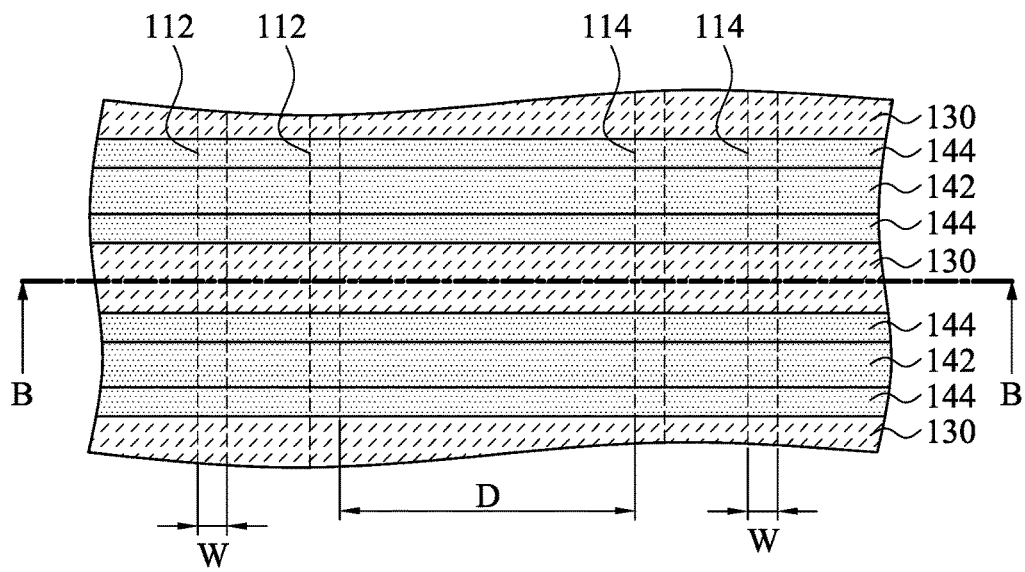

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the present disclosure may be used with other configurations.

Figure 1B:
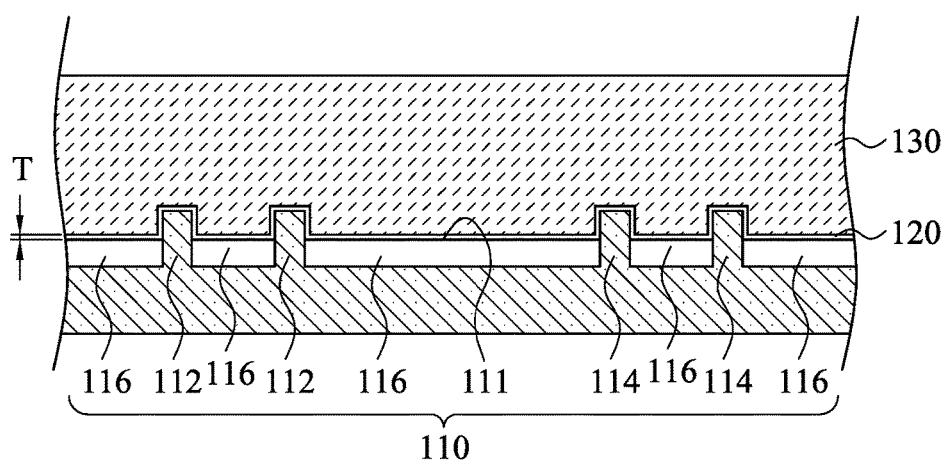

FIGS. 1A to 6A are top views of a method for manufacturing a semiconductor device at various stages in accordance with some embodiments of the present disclosure, and FIGS. 1B to 6B are cross-sectional views respectively taking along line B-B of FIGS. 1A to 6A. Reference is made to FIGS. 1A and 1B. A substrate 110 is provided. The substrate 110 includes first fins 112 and second fins 114 protruded from a top surface 111 of the substrate 110. In some embodiments, the first fins 112 and the second fins 114 include silicon. In some embodiments, the widths W of the first fins 112 and the second fins 114 may be about 10 nm, and the distance D between the adjacent first fin 112 and second fin 114 may be about 35 nm, and the claimed scope of the present disclosure is not limited in this respect. Moreover, it is note that the numbers of the first fins 112 and the second fins 114 in FIGS. 1A and 1B are illustrative, and should not limit the claimed scope of the present disclosure. A person having ordinary skill in the art may select suitable numbers for the first fins 112 and the second fins 114 according to actual situations.

In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the substrate 110 may be an active layer of a semiconductor-on-insulator (SOI) substrate or a multi-layered structure such as a silicon-germanium layer formed on a bulk silicon layer.

The first fins 112 and the second fins 114 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the first fins 112 and the second fins 114 in this case) and developed to remove a portion of the photoresist material. The remaining photoresist material protects the underlying material from subsequent processing steps, such as etching.

It should be noted that other masks, such as an oxide or silicon nitride mask, may also be used in the etching process.

In some other embodiments, the first fins 112 and the second fins 114 may be epitaxially grown. For example, exposed portions of an underlying material, such as an exposed portion of the substrate 110, may be used in an epitaxial process to form the first fins 112 and the second fins 114. A mask may be used to control the shape of the first fins 112 and the second fins 114 during the epitaxial growth process.

In FIG. 1B, the substrate 110 further includes isolation structures 116. The isolation structures 116, which acts as a shallow trench isolation (STI) around the first fins 112 and the second fins 114, may be formed by chemical vapor deposition (CVD) techniques using tetra-ethyl-ortho-silicate (TEOS) and oxygen as a precursor. In some other embodiments, the isolation structures 116 may be formed by implanting ions, such as oxygen, nitrogen, carbon, or the like, into the substrate 110. In yet some other embodiments, the isolation structures 116 are insulator layers of a SOI wafer.

In FIG. 1B, a gate insulator layer 120 is formed on the first fins 112 and the second fins 114. The gate insulator layer 120, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 120 may have a multilayer structure such as one layer of silicon oxide (e.g., interfacial layer) and another layer of high-k material. The gate insulator layer 120 may have a thickness T ranging from about 10 to about 30 angstroms (A). The gate insulator layer 120 may be formed using chemical vapor deposition (CVD), physical vapor deposition (PVD), atomic layer deposition (ALD), thermal oxide, ozone oxidation, other suitable processes, or combinations thereof.

In FIGS. 1A and 1B, a dummy layer 130 is formed over the substrate 110 to cover the gate insulator layer 120, the first fins 112, and the second fins 114. In other words, the gate insulator layer 120 is disposed between the dummy layer 130 and the substrate 110. In some embodiments, the dummy layer 130 includes a semiconductor material such as polysilicon, amorphous silicon, or the like. The dummy layer 130 may be deposited doped or undoped. For example, in some embodiments the dummy layer 130 includes polysilicon deposited undoped by low-pressure chemical vapor deposition (LPCVD). The polysilicon may also be deposited, for example, by furnace deposition of an in-situ doped polysilicon. Alternatively, the dummy layer 130 may includes other suitable materials.

In some embodiments, one or more dielectric layer(s) is formed on opposing sides of the dummy layer 130. For example, in FIGS. 1A and 1B, first dielectric layers 142 and second dielectric layers 144 are together formed at opposing sides of the dummy layer 130. One of the first dielectric layers 142 is disposed between two of the second dielectric layers 144, and one of the second dielectric layers 144 is disposed between one of the first dielectric layers 142 and the dummy layer 130. The first dielectric layer 142 may be made of oxide, and the second dielectric layers 144 may be made of silicon nitride, and the claimed scope is not limited in this respect. The first dielectric layers 142 and the second dielectric layers 144 are typically formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as chemical vapor deposition (CVD), plasma enhanced CVD, sputter, and other methods known in the art. The first dielectric layer 142 and the second dielectric layers 144 may include different materials with different etch characteristics than the dummy layer 130 so that the first dielectric layers 142 and the second dielectric layers 144 may be used as masks for the patterning of the dummy layer 130 (described below with references to FIGS. 3A-3B). The first dielectric layers 142 and the second dielectric layers 144 may then be patterned, such as by one or more etches to remove the portions of the first dielectric layers 142 and the second dielectric layers 144 from the horizontal surfaces of the structure.

Figure 2A:
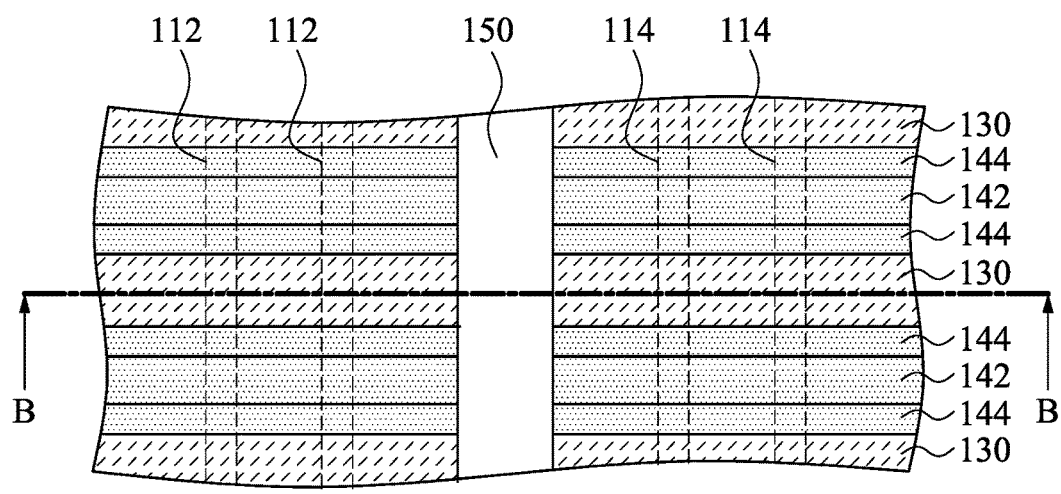
Figure 2B:
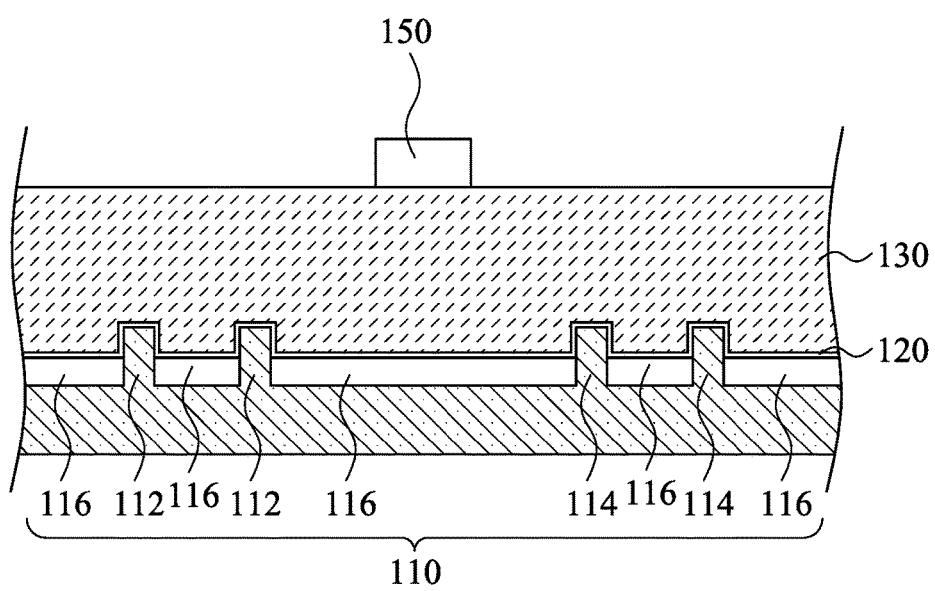

Reference is made to FIGS. 2A and 2B. A mask 150 is formed over the dummy layer 130, the first dielectric layers 142, and the second dielectric layers 144, and is patterned to define an insulation area between gates (see FIGS. 6A and 6B), i.e., to define the ends of the gates. In some embodiments, the mask 150 is a photoresist mask formed by depositing, exposing, and developing a layer of photoresist material. The mask 150 is patterned to form the insulation area between the gates in subsequent processing steps as discussed in greater detail below.

In some embodiments, the mask 150 is trimmed after patterning the mask 150. For example, the mask 150 is etched using isotropic wet etching process, for example, with a plasma process in an $HBr/O_2$ ambient environment for further reducing the critical dimension of the mask 150.

Figure 3A:
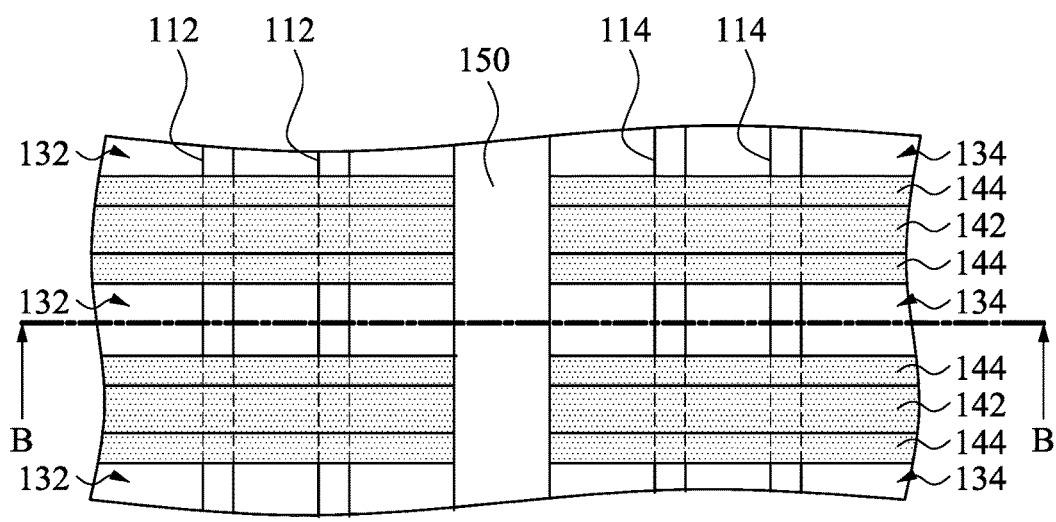
Figure 3B:
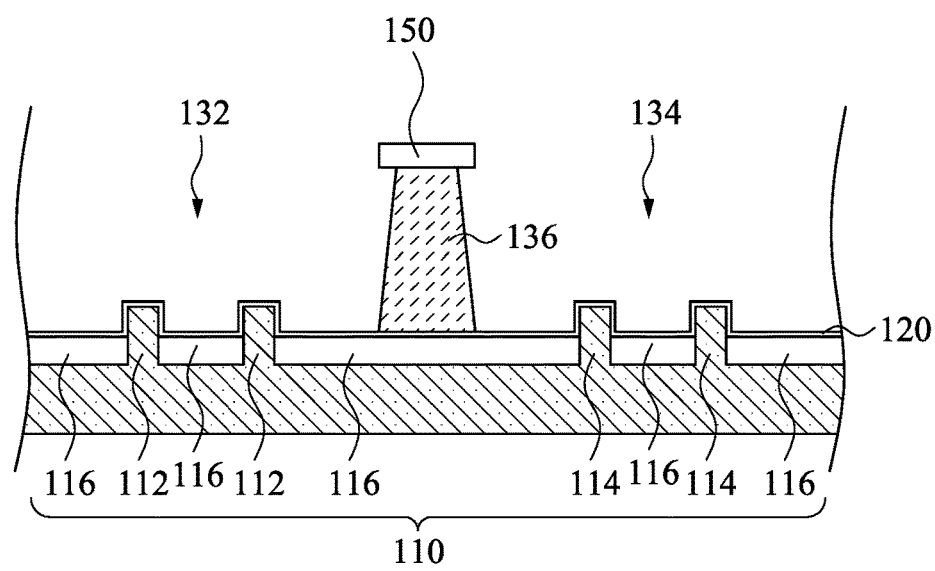

Reference is made to FIGS. 3A and 3B. For clarity, the gate insulator layer 120 is depicted in FIG. 3B and is omitted in FIG. 3A. The dummy layer 130 (see FIGS. 2A and 2B) is removed (or patterned) in the regions exposed by the mask 150 by an etching back process or other suitable process to form a dummy structure 136. For example, the dummy layer 130 may be selectively etched thereby forming a first trench 132 and a second trench 134 between the second dielectric layers 144. The dummy structure 136 is disposed between the first trench 132 and the second trench 134. The first trench 132 exposes portions of the gate insulator layer 120 disposed on the first fins 112, and the second trench 134 exposes some other portions of the gate insulator layer 120 disposed on the second fins 114. The exposed portions of the dummy layer 130 may be removed by a wet etch process that includes exposure to hydroxide containing solution (e.g., ammonium hydroxide), deionized water, and/or other suitable etchant solutions.

Figure 4A:
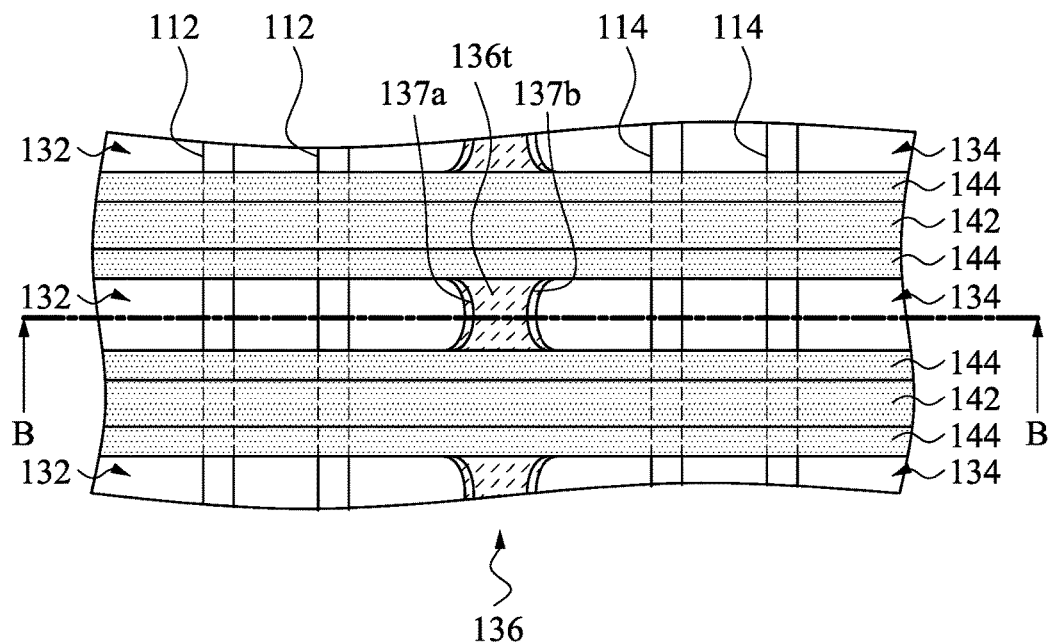
Figure 4B:
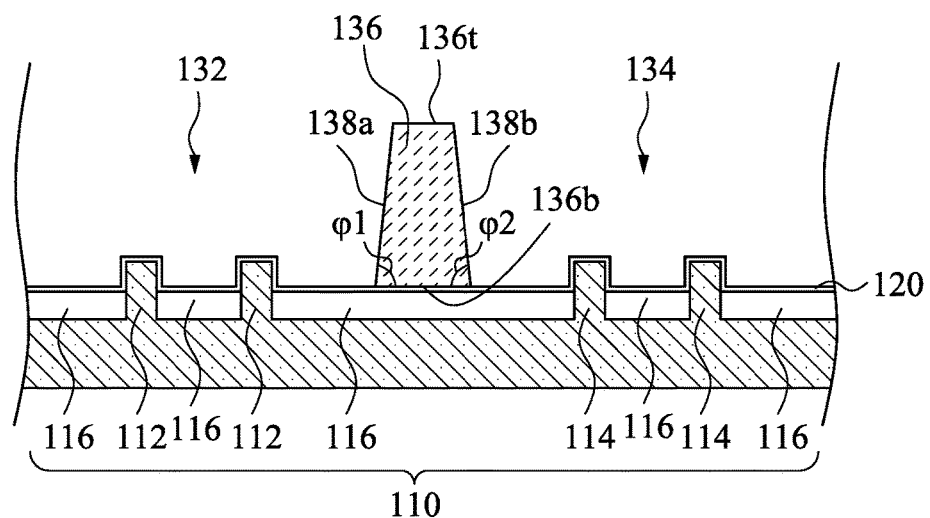

Reference is made to FIGS. 4A and 4B. For clarity, the gate insulator layer 120 is depicted in FIG. 4B and is omitted in FIG. 4A. The mask 150 (see FIGS. 3A and 3B) is removed by an ashing, stripping, or other suitable technique. The remained portion of the dummy layer 130 (see FIG. 2B) forms the dummy structure 136 between the first trench 132 and the second trench 134. The dummy structure 136 may be a plug which is surrounded by two adjacent second dielectric layers 144, the first trench 132, and the second trench 134. The dummy structure 136 has a top surface 136t and a bottom surface 136b opposite to each other. The bottom surface 136b faces the substrate 110. That is, the bottom surface 136b is adjacent to the gate insulator layer 120. In FIG. 4A, the top surface 136t of the dummy structure 136 has two opposite edges 137a and 137b. The edge 137a faces the first trench 132, and the edge 137b faces the second trench 134. Both of the edges 137a and 137b are curved inward the top surface 136t. Furthermore, in FIG. 4B, an area of the bottom surface 136b is greater than an area of the top surface 136t. The dummy structure 136 has two opposite side walls 138a and 138b. The side wall 138a faces the first trench 132, and the side wall 138b faces the second trench 134. An angle φ1 formed between the bottom surface 136b and the side wall 138a is substantially less than 90 degrees, i.e., the angle φ1 is an acute angle. Another angle φ2 formed between the bottom surface 136b and the side wall 138b is substantially less than 90 degrees, i.e., the angle φ2 is an acute angle. Therefore, the dummy structure 130 gets narrower toward the top surface 136t thereof, and gets wider toward the bottom surface 136b thereof.

The terms "substantially" as used herein may be applied to modify any quantitative representation which could permissibly vary without resulting in a change in the basic function to which it is related. For example, the angles φ1 and φ2 as disclosed herein being substantially less than 90 degrees may permissibly vary within the scope of the disclosure if the angles φ1 and φ2 are not structurally altered.

In some embodiments, the dummy structure 136 is trimmed after removing the mask 150 (see FIGS. 3A and 3B). For example, the dummy structure 136 is etched using an isotropic wet etching process for further reducing the critical dimension of the dummy structure 136.

In FIGS. 4A and 4B, the aperture of the first trench 132 near the top surface 136t of the dummy structure 136 is greater than the aperture of the first trench 132 near the bottom surface 136b of the dummy structure 136. Also, the aperture of the second trench 134 near the top surface 136t of the dummy structure 136 is greater than the aperture of the second trench 134 near the bottom surface 136b of the dummy structure 136. A configuration such as this provides a larger process window for a first gate 160 and a second gate 165 filling (see FIGS. 5A and 5B) as discussed in greater detail below.

Figure 5A:
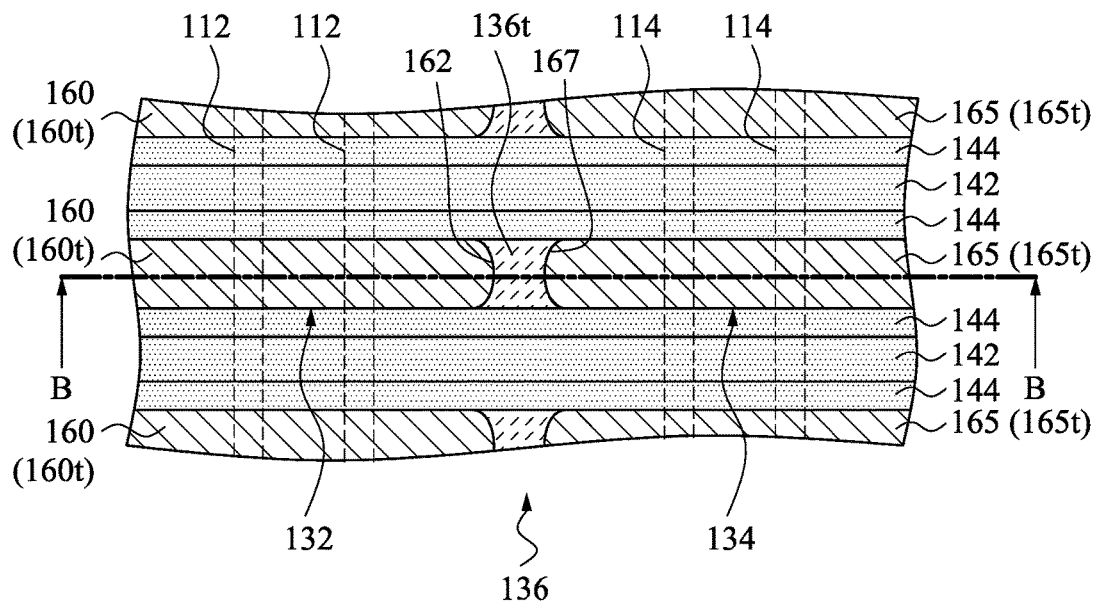
Figure 5B:
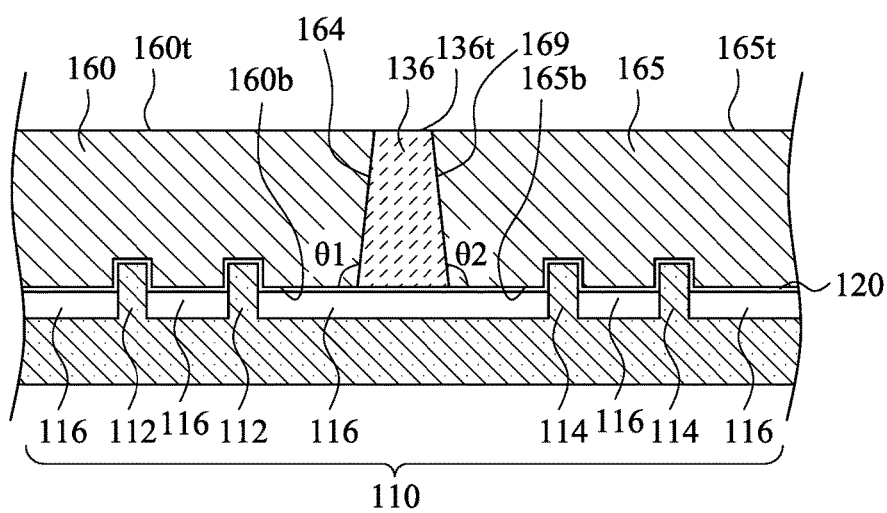

Reference is made to FIGS. 5A and 5B. A first gate 160 is formed to fill the first trench 132, and a second gate 165 is formed to fill the second trench 134. Therefore, the first gate 160 covers the first fins 112, and the second gate 165 covers the second fins 114. The process from FIGS. 3A to 5B is referred as a replacement gate loop process. Furthermore, if the dummy layer 130 of FIGS. 2A and 2B is made of polysilicon, the process from FIGS. 3A to 5B is referred as a replacement polysilicon gate (RPG) loop process. In some embodiments, the first trench 132 and the second trench 134 may be filled with one or more metal layers. The filling process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. Subsequently, a metal chemical mechanical planarization (CMP) process may then be performed to etch back and planarize the metal layers to form the first gate 160 and the second gate 165. The first gate 160 and the second gate 165 may be configured to be coupled to metal interconnects and may be disposed overlying the gate insulator layer 120. The first gate 160 and the second gate 165 may include high-k materials, titanium nitride (TiN), tantalum nitride (TaN), tantalum carbon (TaC), cobalt silicon (CoSi), zirconium silicon (ZrSi$_2$), molybdenum silicon (MoSi$_2$), tantalum silicon (TaSi$_2$), nickel silicon (NiSi$_2$), tungsten nitride (WN), titanium aluminum (TiAl), titanium aluminum nitride (TiNAl), aluminum (Al), titanium (Ti), silver (Ag), tantalum carbon nitride (TaCN), tantalum silicon nitride (TaSiN), manganese (Mn), zirconium (Zr), ruthenium (Ru), molybdenum (Mo), copper (Cu), tungsten (W), cobalt (Co), nickel (Ni), titanium carbon (TiC), titanium aluminum carbon (TiAlC), tantalum aluminum carbon (TaAlC), other suitable conductive materials, or combinations thereof. The first gate 160 and the second gate 165 may be formed by chemical vapor deposition (CVD), physical vapor deposition (PVD), plating, or other suitable processes, and may be followed by a metal CMP process to planarize the gate structure. The first gate 160 and the second gate 165 may have a multilayer structure and may be formed in a multiple-step process.

The first gate 160 has a top surface 160t and a bottom surface 160b opposite to each other. The bottom surface 160b faces the substrate 110. That is, the bottom surface 160b is adjacent to the gate insulator layer 120. In FIG. 5A, the top surface 160t of the first gate 160 has an edge 162 facing the dummy structure 136. The edge 162 is curved toward the top surface 136t of the dummy structure 136. Furthermore, in FIG. 5B, the first gate 160 has a side wall 164 facing the dummy structure 136 and the second gate 165. The side wall 164 is an end of the first gate 160. An angle θ1 formed between the bottom surface 160b and the side wall 164 is substantially greater than 90 degrees, i.e., the angle θ1 is an obtuse angle. Therefore, the first gate 160 gets wider toward the top surface 160t thereof, and gets narrower toward the bottom surface 160b thereof.

Moreover, the second gate 165 has a top surface 165t and a bottom surface 165b opposite to each other. The bottom surface 165b faces the substrate 110. That is, the bottom surface 165b is adjacent to the gate insulator layer 120. In FIG. 5A, the top surface 165t of the second gate 165 has an edge 167 facing the dummy structure 136. The edge 137 is curved toward the top surface 136t of the dummy structure 136. Furthermore, in FIG. 5B, the second gate 165 has a side wall 169 facing the dummy structure 136 and the first gate 160. The side wall 169 is an end of the second gate 165. An angle θ2 formed between the bottom surface 165b and the side wall 169 is substantially greater than 90 degrees, i.e., the angle θ2 is an obtuse angle. Therefore, the second gate 165 gets wider toward the top surface 165t thereof, and gets narrower toward the bottom surface 165b thereof.

Figure 6A:
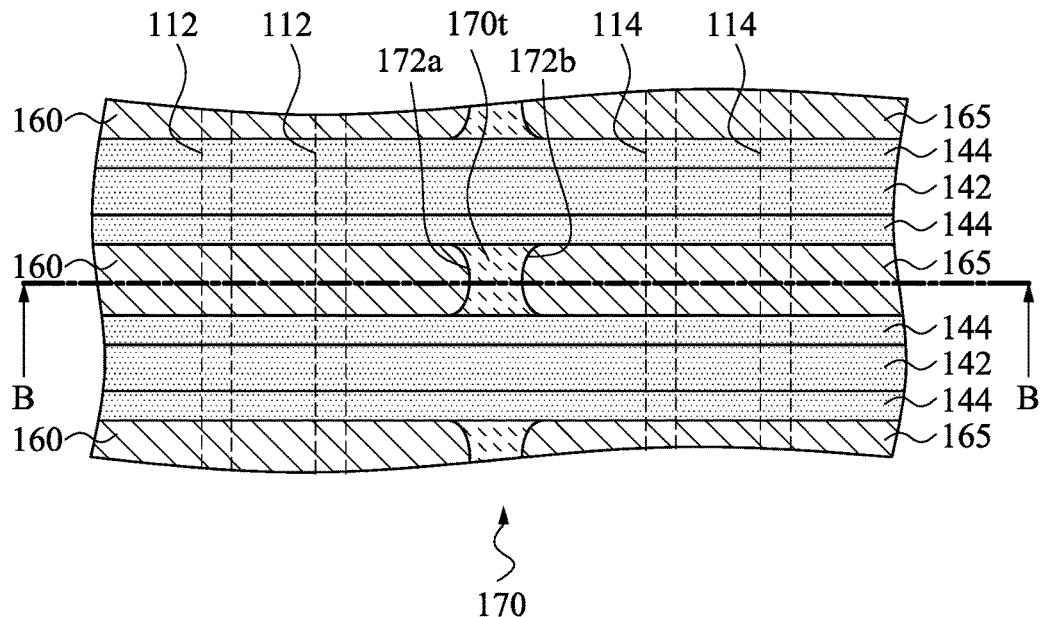
Figure 6B:
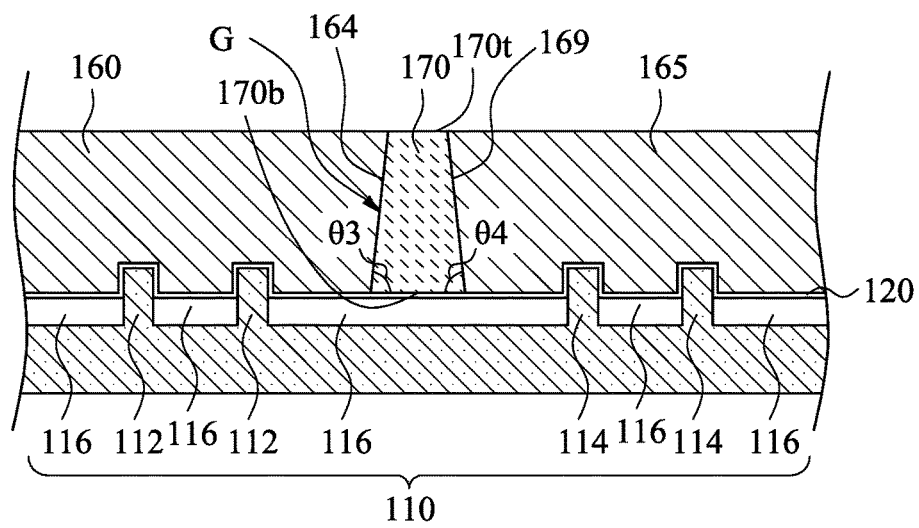

Reference is made to FIGS. 6A and 6B. The dummy structure 136 in FIGS. 5A and 5B is removed by an etching back process or other suitable process. For example, the dummy structure 136 may be selectively etched thereby forming a gap G between the first gate 160 and the second gate 165. The gap G gets wider toward the substrate 110. The dummy structure 136 may be removed by a wet etch process that includes exposure to hydroxide containing solution (e.g., ammonium hydroxide), deionized water, and/or other suitable etchant solutions.

Subsequently, an insulating structure 170 is disposed in the gap G. For example, an inter-layer dielectric (ILD) (not shown) is formed over the first gate 160 and the second gate 165 and in the gap G. In some embodiments, the ILD is formed of an oxide such as phospho-silicate glass (PSG), boro-silicate glass (BSG), boron-doped phospho-silicate glass (BPSG), TEOS, or the like. A CMP process may then be performed to etch back and planarize the ILD to form the insulating structure 170.

The insulating structure 170 may be a plug which is surrounded by two adjacent second dielectric layers 144, the first gate 160, and the second gate 165. The insulating structure 170 has a top surface 170t and a bottom surface 170b opposite to each other. The bottom surface 170b faces the substrate 110. That is, the bottom surface 170b is adjacent to the gate insulator layer 120. In FIG. 6A, the top surface 170t of the insulating structure 170 has two opposite edges 172a and 172b. The edge 172a faces the first gate 160, and the edge 172b faces the second gate 165. Both of the edges 172a and 172b are curved inward the center of the top surface 170t. Furthermore, in FIG. 6B, an area of the bottom surface 170b is greater than an area of the top surface 170t. An angle θ3 formed between the bottom surface 170b of the insulating structure 170 and the side wall 164 of the first gate 160 is substantially less than 90 degrees, i.e., the angle θ3 is an acute angle. Another angle θ4 formed between the bottom surface 170b of the insulating structure 170 and the side wall 169 of the second gate 165 is substantially less than 90 degrees, i.e., the angle θ4 is an acute angle. Therefore, the insulating structure 170 gets narrower toward the top surface 170t thereof, and gets wider toward the bottom surface 170b thereof.

In FIG. 6B, the first gate 160 and the first fins 112 form a fin field effect transistor (finFET), and the second gate 165 and the second fins 114 form another finFET. The first gate 160 and the second gate 165 are isolated by the insulating structure 170. The structure and the manufacturing method mentioned above can improve the gate performance in the replacement gate loop process. A configuration such as this provides a larger distance of gate electrode line end (i.e., the side wall 164 of the first gate 160 in this case) to gate electrode line end (i.e., the side wall 169 of the second gate 165 in this case), thereby increasing the process window and reducing leakage. Additionally, configurations such as these may also provide a larger process window for the first gate 160 and the second gate 165 filling.

Figure 7:
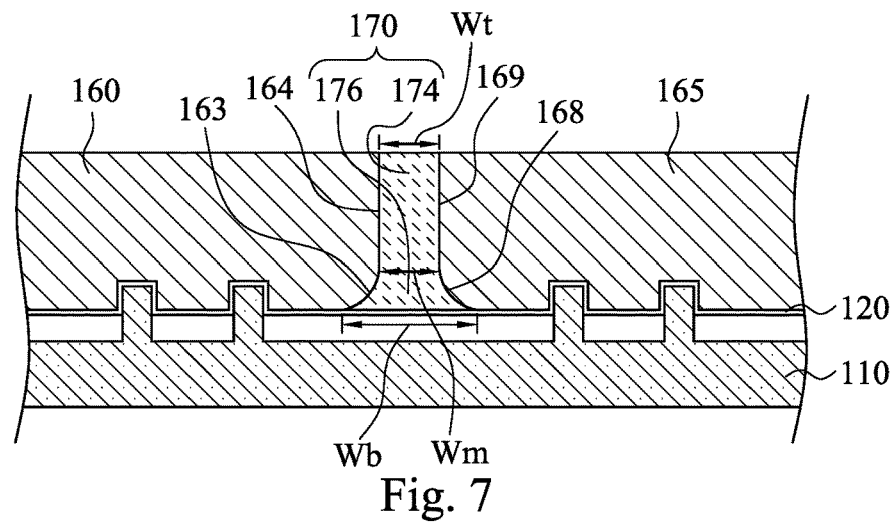
FIG. 7 is a cross-sectional view of a semiconductor device in accordance with some embodiments of the present disclosure.

FIG. 7 is a cross-sectional view of a semiconductor device in accordance with some embodiments of the present disclosure. The difference between the semiconductor devices of FIGS. 7 and 6B pertains to the shapes of the insulating structure 170, the first gate 160, and the second gate 165. In FIG. 7, the insulating structure 170 has a top portion 174 and a bottom portion 176. The bottom portion 176 is disposed between the top portion 174 and the substrate 110. The top portion 174 has a substantially constant width, and the width of the bottom portion 176 gets wider toward the substrate 110. In greater detail, the top portion 174 has a width Wt, the bottom portion 176 has a width Wb, and the insulating structure 170 has a width Wm at the interface between the top portion 174 and the bottom portion 176. In FIG. 7, the width Wt is substantially equal to the width Wm and substantially shorter than the width Wb. Furthermore, the side wall 164 adjacent to the top portion 174 is substantially straight (vertical), and the side wall 164 adjacent to the bottom portion 174 is substantially round. In other words, the first gate 160 has a substantially round corner 163 facing the insulating structure 170 and the substrate 110. Moreover, the side wall 169 adjacent to the top portion 174 is substantially straight (vertical), and the side wall 169 adjacent to the bottom portion 174 is substantially round. In other words, the second gate 165 has a substantially round corner 168 facing the insulating structure 170 and the substrate 110.

Other relevant structural details of the semiconductor device in FIG. 7 are similar to the semiconductor device in FIG. 6B, and, therefore, a description in this regard will not be repeated hereinafter.

Figure 8:
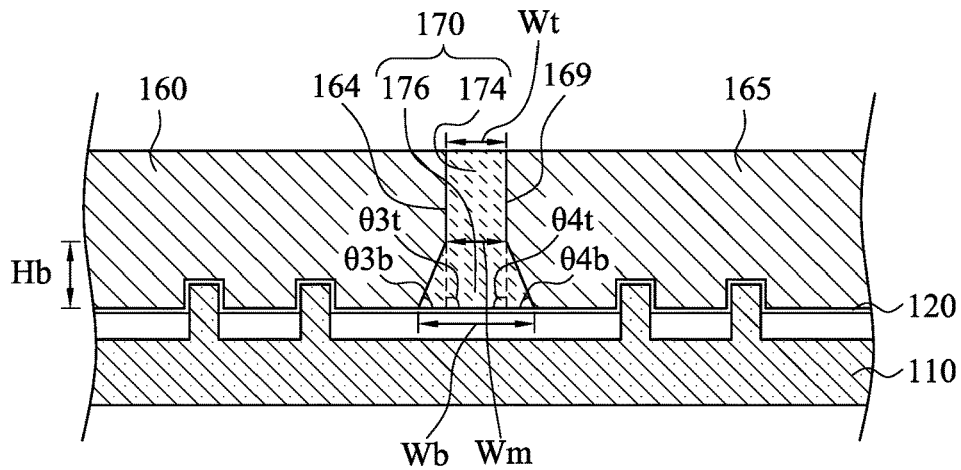
FIG. 8 is a cross-sectional view of a semiconductor device in accordance with some embodiments of the present disclosure.

FIG. 8 is a cross-sectional view of a semiconductor device in accordance with some embodiments of the present disclosure. The difference between the semiconductor devices of FIGS. 8 and 7 pertains to the shapes of the bottom portion 176 of the insulating structure 170. In FIG. 8, the bottom portion 176 has sharp corners, and the width Wt is substantially equal to or shorter than the width Wm and substantially shorter than the width Wb. In greater detail, an angle θ3b formed between the bottom surface 170b of the insulating structure 170 and the side wall 164 adjacent to the bottom portion 176 is substantially less than 90 degrees, i.e., the angle θ3b is an acute angle. Another angle θ4b formed between the bottom surface 170b of the insulating structure 170 and the side wall 169 adjacent to the bottom portion 176 is substantially less than 90 degrees, i.e., the angle θ4b is an acute angle. Furthermore, an angle θ3t formed between the bottom surface 170b of the insulating structure 170 and the side wall 164 adjacent to the top portion 174 is greater than the angle θ3b. Another angle θ4t formed between the bottom surface 170b of the insulating structure 170 and the side wall 169 adjacent to the top portion 174 is greater than the angle θ4b. Moreover, the height Hb of the bottom portion 176 of the insulating structure 170 satisfies 0<Hb<200 nm. Other relevant structural details of the semiconductor device in FIG. 8 are similar to the semiconductor device in FIG. 7, and, therefore, a description in this regard will not be repeated hereinafter.

Figure 9:
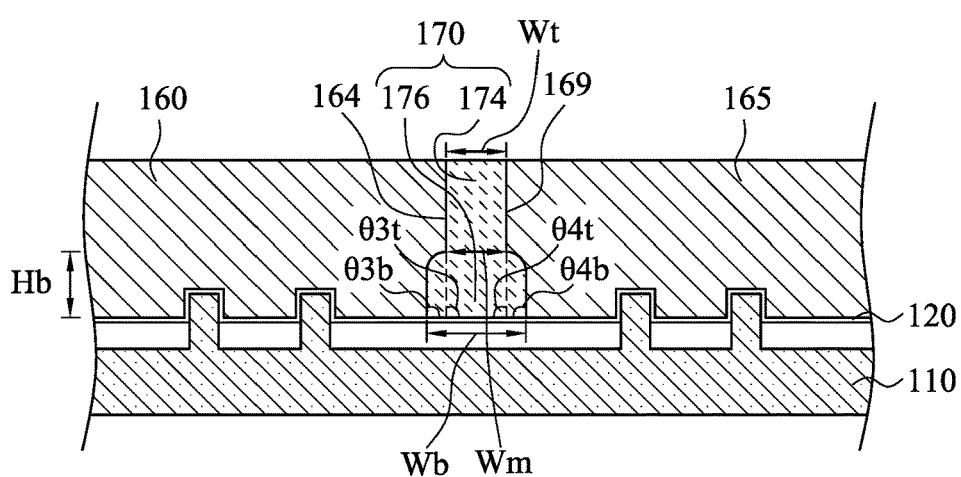
FIG. 9 is a cross-sectional view of a semiconductor device in accordance with some embodiments of the present disclosure.

FIG. 9 is a cross-sectional view of a semiconductor device in accordance with some embodiments of the present disclosure. The difference between the semiconductor devices of FIGS. 9 and 8 pertains to the shapes of the top portion 174 and the bottom portion 176 of the insulating structure 170. In FIG. 9, the width Wt is substantially equal to or shorter than the width Wm and substantially shorter than the width Wb. In greater detail, an angle θ3b formed between the bottom surface 170b of the insulating structure 170 and the side wall 164 adjacent to the bottom portion 176 is about 80 degrees to about 90 degrees. Another angle θ4b formed between the bottom surface 170b of the insulating structure 170 and the side wall 169 adjacent to the bottom portion 176 is about 80 degrees to about 90 degrees. Furthermore, an angle θ3t formed between the bottom surface 170b of the insulating structure 170 and the side wall 164 adjacent to the top portion 174 is smaller than or equal to the angle θ3b. Another angle θ4t formed between the bottom surface 170b of the insulating structure 170 and the side wall 169 adjacent to the top portion 174 is smaller than or equal to the angle θ4b. Moreover, the height Hb of the bottom portion 176 of the insulating structure 170 satisfies 0<Hb<200 nm. Other relevant structural details of the semiconductor device in FIG. 9 are similar to the semiconductor device in FIG. 8, and, therefore, a description in this regard will not be repeated hereinafter.

Moreover, the manufacturing methods of FIGS. 7-9 are similar to the manufacturing method of FIG. 6B. The formation methods of the first trench and the second trench in FIGS. 7-9 can be similar to or different from the formation method mentioned in FIGS. 3A and 3B. The profile of the first trench and the second trench (and also the first gate 160, the second gate 165, and the insulating structure 170) can be modified using different etching method and etching recipes.

As mentioned above, in FIGS. 3A and 3B, the dummy layer 130 is patterned to form the first trench 132 and the second trench 134. Therefore, the aperture of the first trench 132 near the top surface 136t of the dummy structure 136 is greater than the aperture of the first trench 132 near the bottom surface 136b of the dummy structure 136, and the aperture of the second trench 134 near the top surface 136t of the dummy structure 136 is greater than the aperture of the second trench 134 near the bottom surface 136b of the dummy structure 136. With this configuration, the first gate 160 of FIG. 5B is easy to fill in the first trench 132 without leaving a space between the first gate 160 and the substrate 110. Also, the second gate 165 of FIG. 5B is easy to fill in the second trench 134 without leaving a space between the second gate 165 and the substrate 110. Hence, the electrical performance of the first gate 160 and the second gate 165 can be improved.

According to some embodiments of the present disclosure, a semiconductor device includes a semiconductor fin, a gate structure, and an insulating structure. The gate structure is over the semiconductor fin. The insulating structure isolates the gate structure, wherein the insulating structure tapers from bottom to top thereof.

According to some embodiments of the present disclosure, a semiconductor device includes a semiconductor fin, an insulating structure, and a gate structure. The insulating structure is adjacent the semiconductor fin. A top surface of the gate structure has an edge curved outwardly.

According to some embodiments of the present disclosure, a semiconductor device includes a substrate, a gate structure, and an insulating structure. The gate structure is over the substrate. The insulating structure isolates the gate structure. The insulating structure includes a top portion and a bottom portion between the top portion and the substrate and the bottom portion has a curved sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor fin above a substrate;
a first gate structure over the semiconductor fin that includes a first end;
a second gate structure over the semiconductor fin that includes a second end; and
an insulating structure above the substrate and isolating the first end of the first gate structure from the second end of the second gate structure, wherein the insulating structure tapers from bottom to top thereof.

2. The semiconductor device of claim 1, wherein a top surface of the insulating structure is flush with a top surface of the first gate structure.

3. The semiconductor device of claim 1, wherein a bottom surface of the insulating structure is flush with a bottom surface of the first gate structure.

4. The semiconductor device of claim 1, wherein a bottom surface of the insulating structure is larger than a top surface of the insulating structure.

5. The semiconductor device of claim 1, further comprising a pair of dielectric layers on opposite sides of the first gate structure.

6. The semiconductor device of claim 5, wherein the pair of dielectric layers are further on opposite sides of the insulating structure.

7. The semiconductor device of claim 1, further comprising a gate insulation layer between the first gate structure and the semiconductor fin, wherein the insulating structure is over the gate insulation layer.

8. A semiconductor device, comprising:
a semiconductor fin above a substrate;
a first gate structure over the semiconductor fin that includes a first end;
a second gate structure over the semiconductor fin that includes a second end; and
an insulating structure adjacent the semiconductor fin and isolating the first end of the first gate structure from the second end of the second gate structure;
wherein a top surface of the first gate structure has an edge curved outwardly.

9. The semiconductor device of claim 8, wherein the insulating structure has a top portion and the top portion has a uniform width.

10. The semiconductor device of claim 8, wherein the insulating structure has a bottom portion and a sidewall of the bottom portion is curved outwardly.

11. The semiconductor device of claim 8, wherein the insulating structure has a bottom portion and a sidewall of the bottom portion is curved inwardly.

12. The semiconductor device of claim 8, wherein the insulating structure has a bottom portion and a sidewall of the bottom portion is substantially vertical.

13. The semiconductor device of claim 8, wherein a bottom surface of the first gate structure has an edge curved outwardly.

14. The semiconductor device of claim 8, wherein a bottom surface and a sidewall of the insulating structure form an acute angle.

15. The semiconductor device of claim 8, wherein a bottom surface and a sidewall of the insulating structure form a right angle.

16. The semiconductor device of claim 8, wherein a top surface and a sidewall of the insulating structure form an obtuse angle.

17. The semiconductor device of claim 8, wherein a top surface and a sidewall of the insulating structure form a right angle.

18. A semiconductor device, comprising:
a substrate;
a first gate structure over the substrate that includes a first end;
a second gate structure over the semiconductor fin that includes a second end; and
an insulating structure above the substrate and isolating the first end of the first gate structure from the second end of the second gate structure, wherein the insulating structure comprises a top portion and a bottom portion between the top portion and the substrate, and the bottom portion has a curved sidewall.

19. The semiconductor device of claim 18, wherein the curved sidewall is curved outwardly.

20. The semiconductor device of claim 18, wherein the curved sidewall is curved inwardly.

* * * * *